US009418863B2

(12) United States Patent
Hirotsu et al.

(10) Patent No.: US 9,418,863 B2
(45) Date of Patent: Aug. 16, 2016

(54) METHOD FOR ETCHING ETCHING TARGET LAYER

(71) Applicant: TOKYO ELECTRON LIMITED, Tokyo (JP)

(72) Inventors: Shin Hirotsu, Miyagi (JP); Yoshiki Igarashi, Miyagi (JP); Tomonori Miwa, Miyagi (JP); Hiroshi Okada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/709,534

(22) Filed: May 12, 2015

(65) Prior Publication Data

US 2015/0332932 A1 Nov. 19, 2015

(30) Foreign Application Priority Data

May 14, 2014 (JP) ................................. 2014-100538

(51) Int. Cl.
*H01L 21/311* (2006.01)

(52) U.S. Cl.
CPC ........ *H01L 21/311* (2013.01); *H01L 21/31116* (2013.01); *H01L 21/31144* (2013.01)

(58) Field of Classification Search
None
See application file for complete search history.

(56) References Cited

U.S. PATENT DOCUMENTS

| 5,900,163 | A  | * | 5/1999 | Yi ...................... H01L 21/32137 216/75 |
| 5,942,446 | A  | * | 8/1999 | Chen ................. H01L 21/31116 216/67 |
| 6,372,634 | B1 | * | 4/2002 | Qiao ................. H01L 21/31116 257/E21.252 |
| 7,163,898 | B2 | * | 1/2007 | Mariani ............. H01L 21/0337 257/E21.038 |
| 7,541,292 | B2 | * | 6/2009 | Bera .................. H01J 37/32091 216/37 |
| 8,343,874 | B2 | * | 1/2013 | Watanabe ........... H01L 21/0273 257/E21.577 |
| 8,397,668 | B2 | * | 3/2013 | Kobayashi ........ H01J 37/32082 118/715 |
| 8,430,962 | B2 | * | 4/2013 | Masuda ............. C23C 16/45561 118/663 |
| 8,993,429 | B2 | * | 3/2015 | Chen ................. H01L 21/76897 257/211 |
| 2001/0041309 | A1 | * | 11/2001 | Kim ................... H01L 21/32139 430/313 |
| 2007/0251642 | A1 | * | 11/2007 | Bera ................. H01J 37/32082 156/345.26 |
| 2009/0050271 | A1 | * | 2/2009 | Goyal ................. H01L 21/0338 156/345.25 |
| 2009/0156011 | A1 | * | 6/2009 | Belen ..................... H01L 22/20 438/710 |
| 2010/0031211 | A1 | * | 2/2010 | Reed ................... G06F 17/5081 716/124 |
| 2010/0163959 | A1 | * | 7/2010 | Keller ............... H01L 21/28273 257/321 |
| 2010/0178770 | A1 | * | 7/2010 | Zin ................... H01L 21/31116 438/694 |
| 2011/0177669 | A1 | * | 7/2011 | Lee ........................ H01J 37/321 438/400 |
| 2011/0244686 | A1 | * | 10/2011 | Aso ................... H01L 21/30655 438/694 |
| 2013/0059450 | A1 |   | 3/2013 | Le Gouil et al. |
| 2014/0213060 | A1 | * | 7/2014 | Kao .................. H01L 21/31144 438/703 |
| 2014/0273462 | A1 | * | 9/2014 | Simsek-Ege ...... H01L 27/11578 438/696 |

\* cited by examiner

*Primary Examiner* — Allan Olsen
(74) *Attorney, Agent, or Firm* — Rothwell, Figg, Ernst & Manbeck, P.C.

(57) ABSTRACT

Disclosed is an etching method for etching an etching target layer. The etching method includes: a first step of depositing a plasma reaction product on a mask layer made of an organic film formed on the etching target layer; and after the first step, a second step of etching the etching target layer. The mask layer includes a coarse region in which a plurality of openings are formed, and a dense region surrounding the coarse region. The mask layer exists more densely in the dense region than in the coarse region. The coarse region includes a first region and a second region positioned close to the dense region compared to the first region. In the second step of the etching method, a width of the openings in the first region becomes narrower than a width of the openings in the second region.

10 Claims, 7 Drawing Sheets

METHOD FOR ETCHING ETCHING TARGET LAYER

CROSS-REFERENCE TO RELATED APPLICATIONS

This application is based on and claims priority from Japanese Patent Application No. 2014-100538, filed on May 14, 2014, with the Japan Patent Office, the disclosures of which are incorporated herein in their entireties by reference.

TECHNICAL FIELD

An exemplary embodiment of the present disclosure relates to a method for etching an etching target layer.

BACKGROUND

As a kind of semiconductor device, a NAND-type flash memory device having a three-dimensional structure is known. This device has a multilayer film which is configured by forming two layers having different dielectric constants alternately. In manufacturing the device, a plurality of deep holes is formed in the multilayer film by an etching of the multilayer film. This etching method is disclosed in U.S. Patent Application Publication No. 2013-0059450.

Specifically, in the etching method disclosed in U.S. Patent Application Publication No. 2013-0059450, a processing target object having a mask made of amorphous carbon on the multilayer film is exposed to plasma of a processing gas containing $CH_2F_2$ gas, $N_2$ gas, and $NF_3$.

In the method in which a plurality of openings such as deep holes is formed in an etching target layer as disclosed in U.S. Patent Application Publication No. 2013-0059450, in order to enhance verticality of a wall surface defining the opening, the etching of the multilayer film is performed while protecting the wall surface or a surface of the mask by a plasma reaction product.

SUMMARY

In an aspect, there is provided an etching method for etching an etching target layer. The etching method includes: (a) depositing a plasma reaction product on a mask layer made of an organic film formed on the etching target layer (hereinafter, referred to as "first step"); and (b) after the first step, etching the etching target layer (here, wherein after referred to as "second step"). The mask layer includes a coarse region in which a plurality of openings are formed, and a dense region surrounding the coarse region. The mask layer exists more densely in the dense region than in the coarse region. The coarse region includes a first region and a second region positioned close to the dense region compared to the first region. In the second step of the etching method, a width of the openings in the first region becomes narrower than a width of the openings in the second region.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
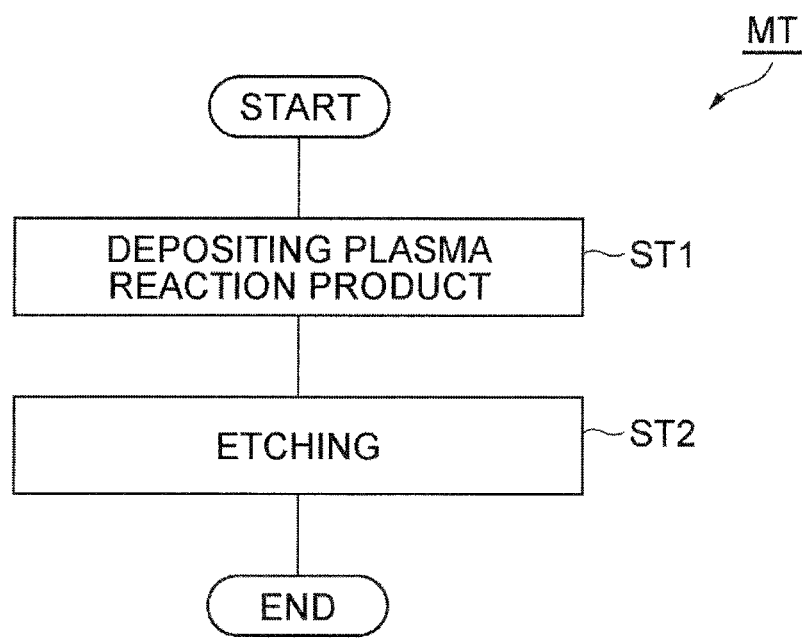
FIG. 1 is a flow chart illustrating an exemplary embodiment of a method for etching an etching target layer.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Even if the conventional etching method described above is used in order to form a plurality of openings on in the etching target layer, the widths of the plurality of openings may become different from each other. Therefore, it is necessary to reduce a difference in the widths among the plurality of openings formed in the etching target layer.

In an aspect, there is provided an etching method for etching an etching target layer. The etching method includes: (a) depositing a plasma reaction product on a mask layer made of an organic film formed on the etching target layer (hereinafter, referred to as "first step"); and (b) after the first step, etching the etching target layer (here, wherein after referred to as "second step"). The mask layer includes a coarse region in which a plurality of openings are formed, and a dense region surrounding the coarse region. The mask layer exists more densely in the dense region than in the coarse region. The coarse region includes a first region and a second region positioned close to the dense region compared to the first region. In the second step of the etching method, a width of the openings in the first region becomes narrower than a width of the openings in the second region.

In general, when the etching target layer is etched while depositing the plasma reaction product, a larger amount of plasma reaction product is deposited in the second region where the mask layer is densely formed and a region immediately below the second region than in the first region spaced apart from the dense region and a region immediately below the first region. Thus, the width of the opening formed immediately below the second region in the etching target layer decreases. Meanwhile, according to the method related to the aspect described above, the width of the openings in the first region becomes narrower than the width of the openings in the second region by performing the first step. Thereafter, in the second step, when the etching target layer is etched while depositing the plasma reaction product, the difference in the width between the opening formed in the region immediately below the first region within the etching target layer and the width of the opening formed in the region immediately below the second region within the etching target layer decreases. For example, the width of the opening formed in the region immediately below the first region within the etching target layer and the width of the opening formed in the region immediately below the second region within the etching target layer become substantially equal to each other. Therefore, according to this method, it is possible to reduce the difference in the widths among the plurality of openings formed in the etching target layer.

In the first step of an exemplary embodiment, plasma of a mixed gas including a silicon containing gas, an oxygen containing gas, and/or a hydrogen containing gas is generated. When the mixed gas used in the first step includes the oxygen containing gas in addition to the silicon containing gas, silicon oxide is generated as the plasma reaction product deposited on the mask. Since more active species of oxygen are consumed to react with a material constituting the mask in the dense region than in the dense region, the amount of the silicon oxide generated in the vicinity of the second region positioned close to the dense region becomes less than the amount of the silicon oxide generated in the vicinity of the first region spaced apart from the dense region. Thus, the width of the openings in the first region becomes narrower than the width of the openings in the second region by performing the first step. Likewise, when the mixed gas used in the first step includes the hydrogen containing gas in addition to the silicon containing gas, SiH is generated as the plasma reaction product deposited on the mask. Since more active species of hydrogen are consumed to react with a material constituting the mask in the dense region, the amount of SiH generated in the vicinity of the second region positioned close to the dense region is less than the amount of SiH generated in the vicinity of the first region spaced apart from the dense region. Thus, the width of the openings in the first region becomes narrower than the width of the openings in the second region by performing first step.

In an exemplary embodiment, the silicon containing gas may include $SiCl_4$ or $SiF_4$. In an exemplary embodiment, the oxygen containing gas may be $O_2$ gas. In an exemplary embodiment, the hydrogen containing gas may be hydrocarbon gas.

In an exemplary embodiment, the etching target layer may be a multilayer film formed by alternately laminating a first dielectric film made of silicon oxide and a second dielectric film made of silicon nitride.

In the second step of an exemplary embodiment, plasma of a processing gas including hydrogen gas, hydrogen bromide gas, and nitrogen trifluoride gas, and further including at least one of hydrocarbon gas, fluorohydrocarbon gas, and fluorocarbon gas may be generated. Especially, the processing gas used in second step includes carbon and hydrogen. Further, a relatively large number of atoms of hydrogen are included in this processing gas. Thus, the protective film PF including carbon and having a high hardness is formed on a surface of the mask layer during the etching of the second step. As a result, it is possible to maintain the shape of the mask layer until the etching is terminated. That is, it is possible to improve mask selectivity.

In an exemplary embodiment, the fluorohydrocarbon gas may be $CH_2F_2$ gas, $CH_3F$ gas, or $CHF_3$ gas.

Further, in an exemplary embodiment, the organic film may be an amorphous carbon film.

As described above, it is possible to reduce a difference in the widths among the plurality of openings formed in the etching target layer.

Hereinafter, various exemplary embodiments will be described in detail with reference to the accompanying drawings. In the following description, same or corresponding elements will be given the same reference numerals.

Figure 2:
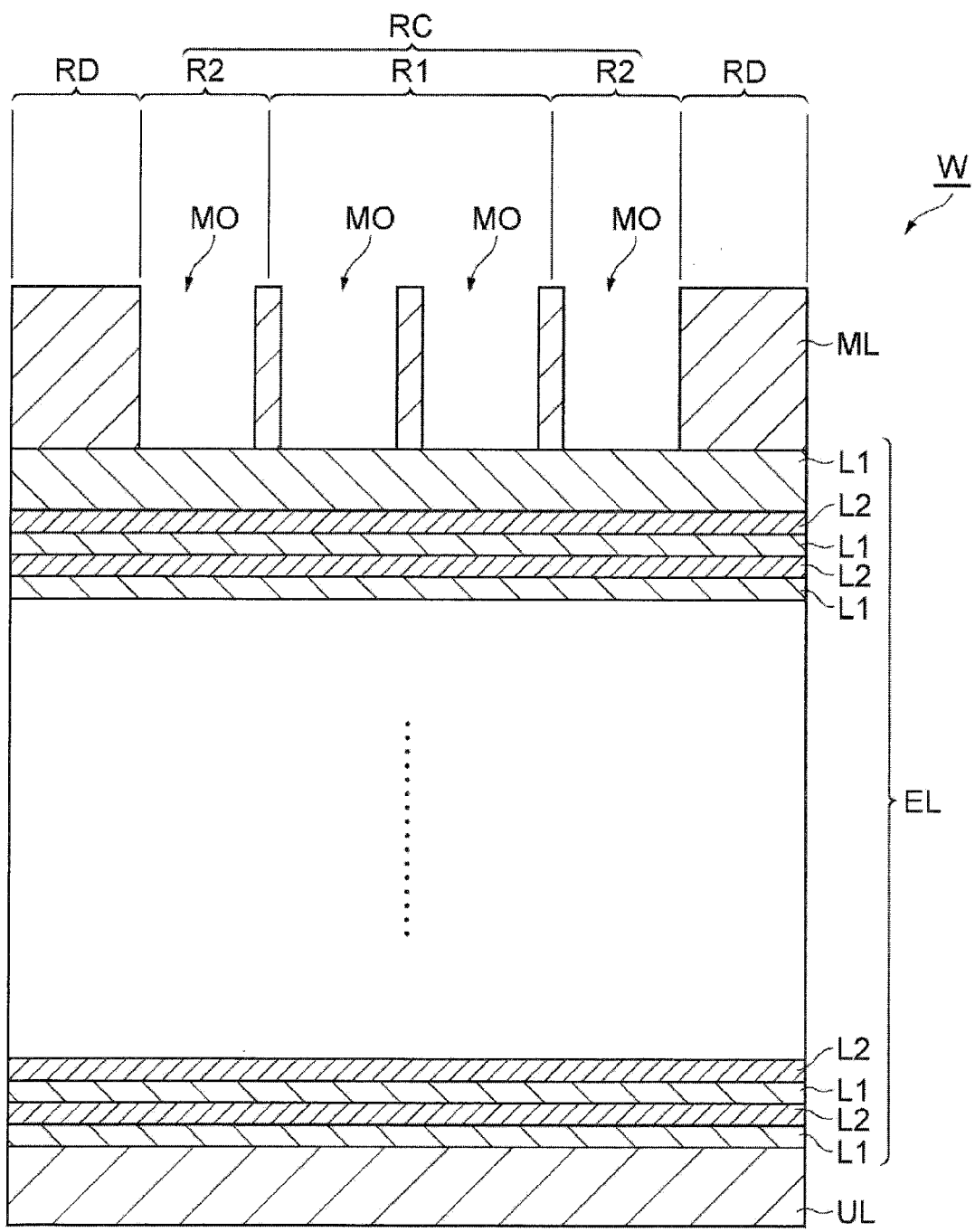
FIG. 2 is a cross-sectional view of an exemplary processing target object.
Figure 3A:
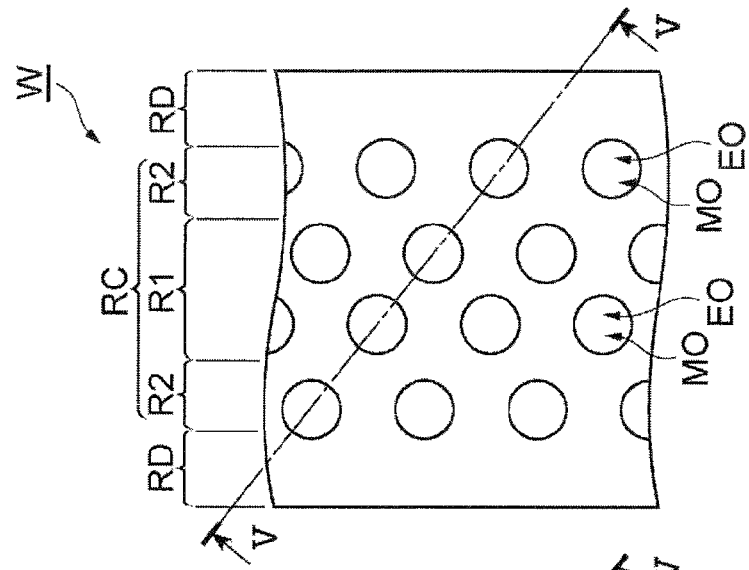
FIGS. 3A to 3C are plan views illustrating states of a processing target object before the method illustrated in FIG. 1 is performed and after respective steps of the method illustrated in FIG. 1 have been performed.
Figure 3B:
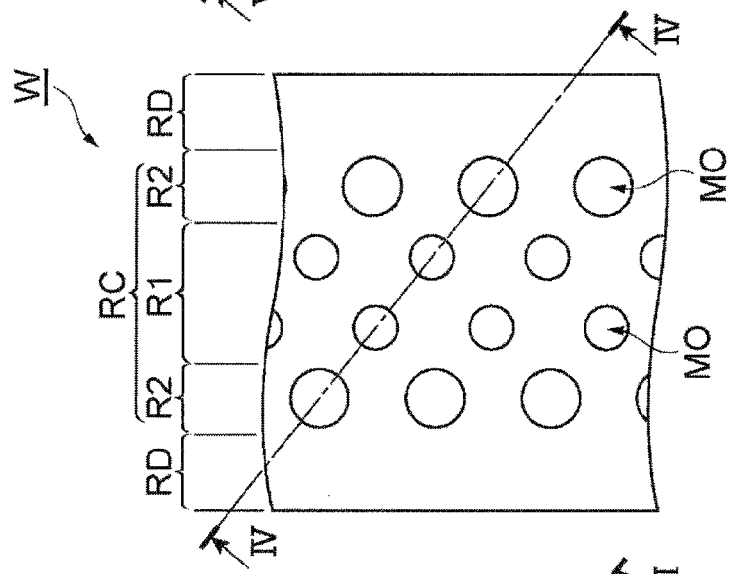
Figure 3C:
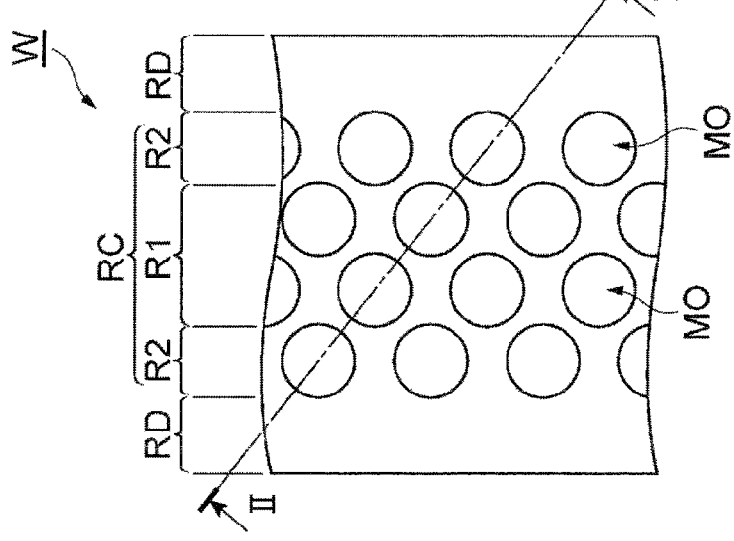

FIG. 1 is a flow chart illustrating an exemplary embodiment of a method for etching an etching target layer. The method MT1 illustrated in FIG. 1 includes a first step ST1 for depositing plasma reaction product on a mask layer, and a second step ST2 for etching the etching target layer. The method MT may be applied to a processing target object (hereinafter, also referred to as "wafer W") illustrated in FIG. 2 and FIG. 3A. FIG. 2 is a cross-sectional view of an exemplary processing target object. FIGS. 3A to 3C are plan views illustrating the states of a processing target object before the method illustrated in FIG. 1 is performed and after respective steps of the method illustrated in FIG. 1 have been performed. FIGS. 3A to 3C illustrate plan views of the wafer W which is viewed from the top side of a mask layer ML.

As illustrated in FIG. 2, the wafer W includes an etching target layer EL and a mask layer ML. In an exemplary embodiment, the wafer W further includes a base layer UL. In this exemplary embodiment, the wafer W includes the etching target layer EL on the base layer UL, and includes the mask layer ML on the etching target layer EL.

The etching target layer EL is a layer to be etched, in which the pattern of the mask layer ML is transferred to the etching target layer EL. In an exemplary embodiment, the etching target layer EL is a multilayer film that includes first dielectric films L1 and second dielectric films L2, which are alternately laminated. For example, the first dielectric films L1 may be made of silicon oxide and the second dielectric films L2 may be made of silicon nitride. The thickness of each first dielectric film L1 is, for example, 5 nm to 50 nm, and the thickness of each second dielectric film L2 is, for example, 10 nm to 75 nm. Further, the etching target layer EL may include twenty four pairs of laminated films, each pair including one first dielectric film L1 and one second dielectric film L2 formed immediately on the first dielectric film L1.

The mask layer ML is made of an organic film. This organic film is, for example, an amorphous carbon film. As illustrated in FIG. 2 and FIG. 3A, the mask layer ML includes a coarse region RC and a dense region RD. The coarse region RC is surrounded by the dense regions RD. A plurality of openings MO is formed in the coarse region RC. The etching target layer EL is exposed to the plurality of openings MO. Further, in the dense region RD, a mask layer exists more densely than the coarse region RC. In an exemplary embodiment, no opening is formed in the dense region RD. However, in another exemplary embodiment, the openings MO may be formed in the dense region RD in a lower density than the coarse region RC.

In an exemplary embodiment, a plurality of openings MO is holes which are arranged in four rows. The arrangement aspect of the openings MO is not limited to those illustrated in FIG. 2 and FIG. 3A. The plurality of openings MO may be arranged either in, for example, more than four rows or in less than four rows. Further, each of the plurality of openings MO may be a groove.

The coarse region RC includes a first region R1 and a second region R2. The second region R2 is a region positioned close to the dense region RD compared to the first region R1. As illustrated, the plurality of openings MO is formed in both of the first and second regions R1 and R2.

Figure 4:
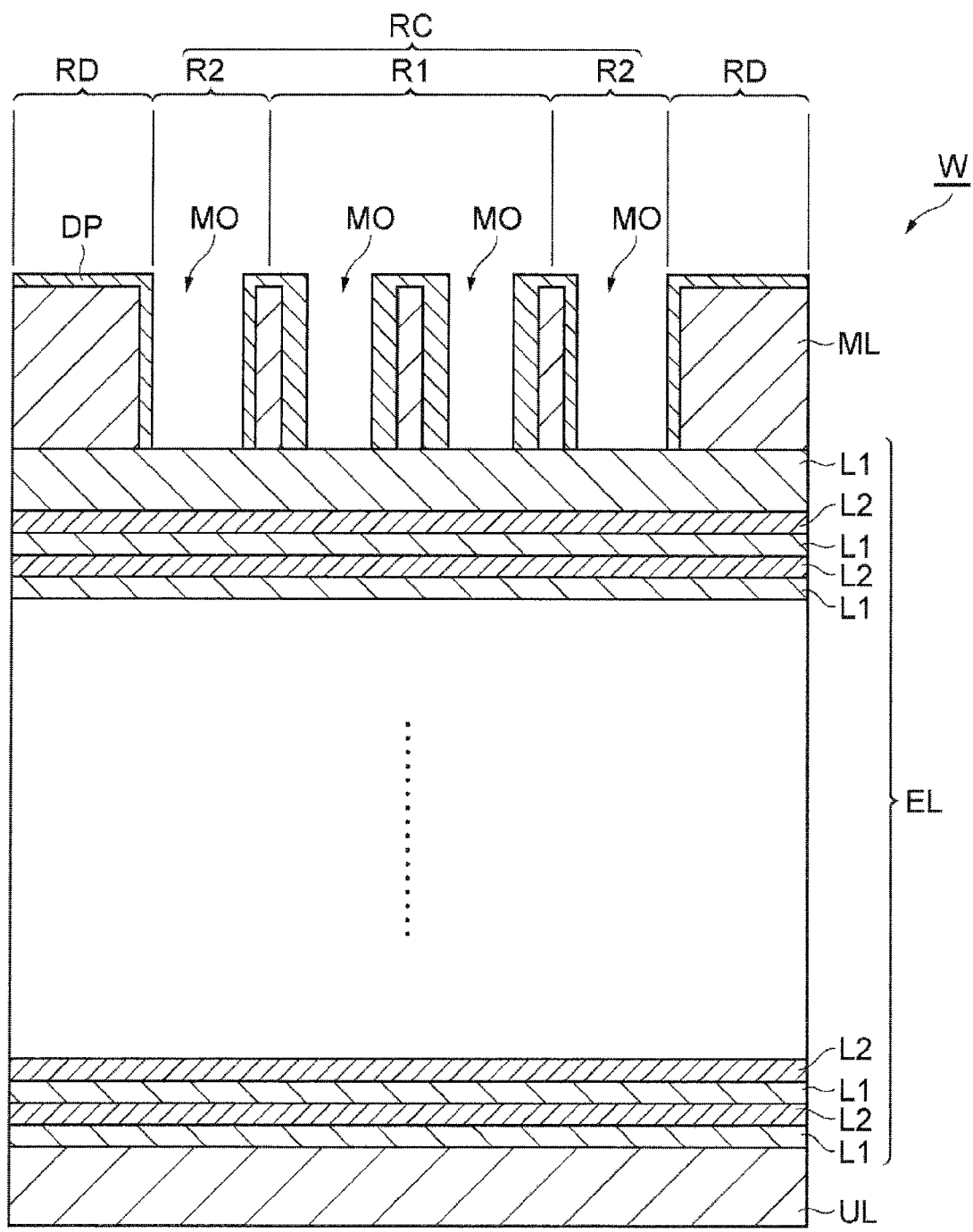
FIG. 4 is a cross-sectional view illustrating the state of the processing target object after a first step of the method illustrated in FIG. 1 has been performed.
Figure 5:
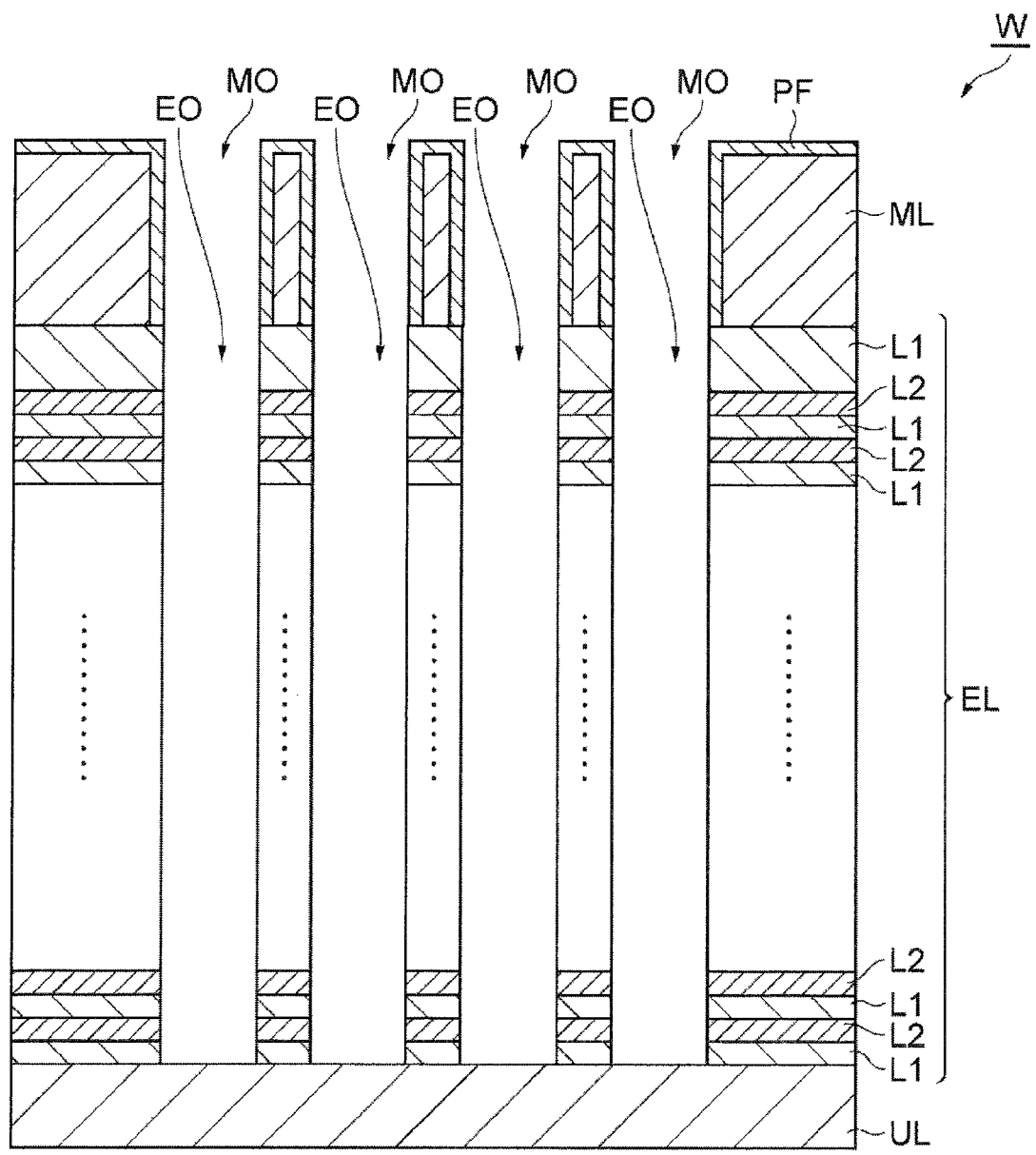
FIG. 5 is a cross-sectional view illustrating the state of the processing target object after a second step of the method illustrated in FIG. 1 has been performed.

Hereinafter, the method MT will be described in detail with reference to FIGS. 1, 3A to 3C, 4, and 5. FIG. 4 is a cross-sectional view illustrating a state of a processing target object after a first step of the method illustrated in FIG. 1 has been performed, in which FIG. 4 illustrates a cross-sectional view taken along line IV-IV in FIG. 3B. FIG. 5 is a cross-sectional view illustrating a state of the processing target object after a second step of the method illustrated in FIG. 1 has been performed, in which FIG. 4 illustrates a cross-sectional view taken along line V-V of FIG. 3C.

In first step ST1 of the method MT, the plasma reaction product is deposited on the mask layer ML so that a deposit DP is formed on the mask layer ML as illustrated in FIG. 4. As illustrated in FIG. 3B and FIG. 4, the width of the openings MO in the first region R1 becomes narrower than that of the openings MO in the second region R2 by first step ST1.

In first step ST1 of an exemplary embodiment, plasma of a mixed gas including a silicon containing gas, an oxygen containing gas, and/or a hydrogen containing gas is generated in the processing container of the plasma processing apparatus in which the wafer W is received. The silicon containing gas includes, for example, $SiCl_4$ and/or $SiF_4$. Further, the oxygen containing gas is, for example, $O_2$ gas. Further, the hydrogen containing gas may be hydrocarbon gas, or may be, for example, $CH_4$ gas.

When the mixed gas used in first step ST1 includes the $SiCl_4$ gas or the $O_2$ gas, silicon oxide and $Cl_2$ are generated in the plasma. The silicon oxide SiO is deposited on the mask layer ML as the plasma reaction product, thereby forming the deposit DP. Here, more active species of oxygen are consumed to react with a material constituting the mask layer ML, that is, carbon, in the dense region RD than in the coarse region RC. Therefore, the amount of the silicon oxide generated in the vicinity of the second region R2 which is close to the dense region RD becomes less than the amount of the silicon oxide generated in the vicinity of the first region R1 which is spaced apart from the dense region RD. Therefore, the width of the openings MO in the first region R1 is narrower than the width of the openings MO in the second region R2 by performing first step ST1.

Further, when the mixed gas used in first step ST1 includes $SiCl_4$ gas and $CH_4$ gas, ions or radicals of, for example, SiC, SiH, $Cl_2$, and $H_2$ are generated in the plasma. Ions or radicals of SiC and SiH are deposited on the mask layer ML as the plasma reaction product so as to form the deposit DP. Here, more active species of hydrogen are consumed to react with carbon in the dense region RD than in the coarse region RC. Thus, the amount of the SiH generated in the vicinity of the second region R2 which is close to the dense region RD is less than the amount of SiH generated in the vicinity of the first region R1 which is spaced apart from the dense region RD. Thus, even in this case, the width of the openings MO in the first region R1 is less than that in the second regions R2.

Subsequently, in second step ST2 of the method MT, the etching target layer EL is etched. As a result, as illustrated in FIG. 5, openings EO which is continuous to the openings MO are formed in the etching target layer EL. In second step ST2, plasma of a processing gas is generated within the processing container of the plasma processing apparatus. In second step ST2, the etching target layer EL and the deposit DP are etched by the active species generated in the plasma of the processing gas, and the plasma reaction product is deposited on the mask layer ML so as to form the protective film PF together with the remaining deposit DP. The film thickness of the protective film PF becomes thicker in the second region R2, but is thinner in the first region R1. Further, as described above, the width of the openings MO in the first region R1 is narrower than that of the openings MO in the second region R2 by performing first step ST1. Therefore, as illustrated in FIG. 3C and FIG. 5, a difference in the widths between the openings EO formed in a region within the etching target layer EL immediately below the first region R1 and the openings EO formed in a region within the etching target layer EL immediately below the second region R2 decreases by performing second step ST2. For example, the width of the openings EO formed in the region within the etching target layer EL immediately below the first region R1 and the width of the openings EO formed in the region within the etching target layer EL immediately below the second region R2 are substantially the same.

In second step ST2 of an exemplary embodiment, as for the processing gas, a processing gas including hydrogen gas, hydrogen bromide gas, and nitrogen trifluoride gas, and further including at least one of hydrocarbon gas, fluorohydrocarbon gas, and fluorocarbon gas, is used. In an exemplary embodiment, the fluorocarbon gas may be $CH_2F_2$ gas, $CH_3F$ gas, or $CHF_3$ gas.

Especially, the processing gas used in second step ST2 includes carbon and hydrogen. Further, a relatively large number of atoms of hydrogen are included in this processing gas. Thus, the protective film PF including carbon and having a high hardness is formed on the surface of the mask layer ML during the etching of second step ST2. That is, the protective film PF is formed on the side wall portions of the openings MO. As a result, it is possible to maintain the shape of the mask layer ML until the etching is terminated. That is, it is possible to improve the mask selectivity.

Further, since a relatively large number of active species of hydrogen are included in the plasma of the processing gas, the etching rate of the second dielectric film L2 increases. As a result, the etching rate of the etching target layer EL increases.

Further, since active species of bromine are included in the plasma of the processing gas, a film of an etching byproduct such as, for example, SiBrO is formed on a surface that defines the openings formed in the etching target layer EL. Thus, the wall surfaces which define the openings formed in the etching target layer EL form smooth surfaces.

In an exemplary embodiment, a temperature of the wafer W may be changed within a period in which second step ST2 is performed. Here, when the temperature of the wafer W low, the etching rate of the etching target layer EL increases and the width of the openings formed in the etching target layer EL increases. Meanwhile, when the temperature of the wafer W high, the etching rate of the etching target layer EL decreases. However, a thick protective film may be formed, and an opening having a width that becomes narrow as it become close to a deep portion thereof in a depth direction and is generally narrow may be formed. Therefore, during second step ST2, it is possible to form an opening having a high verticality and a narrow width by changing the temperature of the wafer W.

In second step ST2 of a specific example, the temperature of the wafer W during a first period is set to be higher than the temperature of the wafer W during a second period after the first period. That is, the temperature of the wafer W is set to be relatively high in the first period of second step ST2 and is set to be relatively low in the second period of second step ST2. For example, the first period is a period from the start of second step ST2 to the middle time point thereof, and the second period is a period from the middle time point to the termination of second step ST2. Further, the temperature of the wafer W during the first period is, for example, 30° C., and the temperature of the wafer W during the second period is, for example, 10° C. According to second step ST2 described above, in the first period, an opening having a width that becomes narrow as it becomes close to a deep portion thereof in a depth direction, and a thick protective film may be formed on the wall surface which defines the opening. Further, in the second period, the width of the opening may increase. Thus, it is possible to form the opening having the narrow width and high verticality by changing the temperature of the wafer W.

Figure 6:
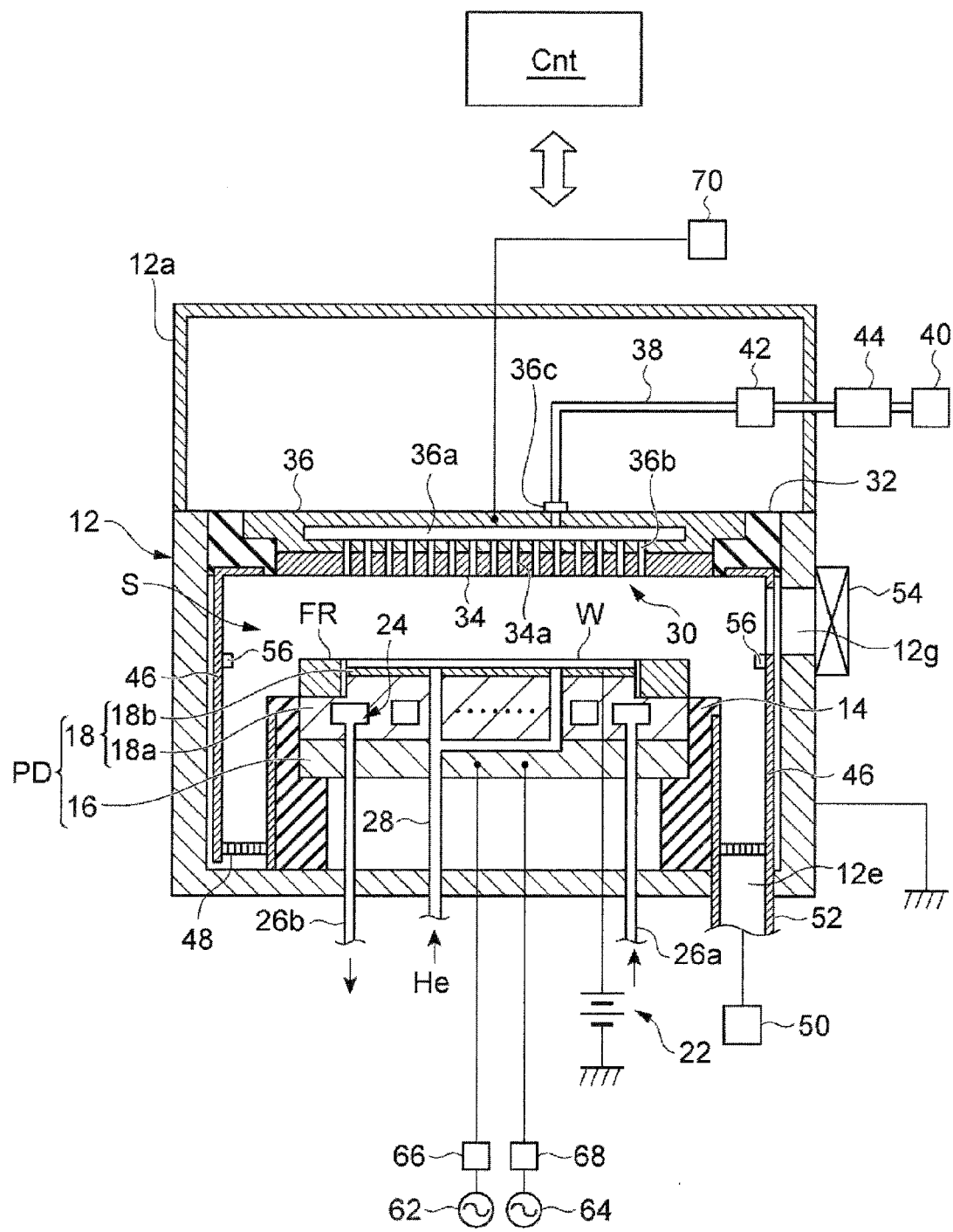
FIG. 6 is a view schematically illustrating an exemplary plasma processing apparatus.

Hereinafter, the descriptions will be made on the plasma processing apparatus which may be used for performing the method MT with reference to FIG. 6. FIG. 6 is a view schematically illustrating an exemplary plasma processing apparatus. The plasma processing apparatus 10 illustrated in FIG. 6 is a capacitively coupled plasma etching apparatus, and is provided with a substantially cylindrical processing container 12. The inner wall surface of the processing container 12 is made of, for example, anodized aluminum. The processing container 12 is grounded for safety.

A substantially cylindrical support 14 made of an insulating material is provided on a bottom portion of the processing container 12. The support 14 extends vertically from the bottom portion of the processing container 12 within the processing container 12. The support 14 supports the placing table PD provided within the processing container 12.

The placing table PD holds the wafer W on the top surface thereof. The placing table PD may include a lower electrode 16 and a support 18. The lower electrode 16 is made of a metal such as, for example, aluminum, and has substantially a disk shape. The support 18 is provided on the top surface of the lower electrode 16.

The support 18 supports the wafer W, and includes a base 18a and an electrostatic chuck 18b. The base 18a is made of a metal such as, for example, aluminum, and has substantially a disk shape. The base 18a is provided on the lower electrode 16 and is electrically connected to the lower electrode 16. The base 18a is provided on the base 18a. The electrostatic chuck 18b has a structure in which an electrode is provided between a pair of insulation layers or insulation sheets. A direct current ("DC") power supply 22 is electrically connected to the electrode of the electrostatic chuck 18b. The electrostatic chuck 18b attracts the wafer W by an electrostatic force such as a Coulomb force generated by a DC voltage from the DC power supply 22.

A focus ring FR is disposed on a peripheral portion of the base 18a of the support 18 to surround the peripheral edge of the wafer W and the electrostatic chuck 18b. The focus ring FR is provided so as to improve etching uniformity. The focus ring FR is made of a material properly selected according to a material of an etching target film, and may be made of, for example, quartz.

A coolant flow path 24 is formed within the second plate 18b. A coolant having a predetermined temperature is supplied to the coolant flow path 24 to be circulated from a chiller unit which is provided outside through pipes 26a and 26b. By controlling the temperature of the coolant circulated in this way, the temperature of the wafer W supported on the support 18 is controlled.

Further, a gas supply line 28 is provided in the plasma processing apparatus 10. The gas supply line 28 supplies a heat transfer gas such as, for example, He gas, from a heat transfer gas supply mechanism between the top surface of the electrostatic chuck 18b and the rear surface of the wafer W.

The plasma processing apparatus 10 is provided with an upper electrode 30. The upper electrode 30 is disposed above the placing table PD to face the placing table PD. The lower electrode 16 and the upper electrode 30 are provided substantially in parallel to each other. A processing space S configured to perform a plasma processing on the wafer W is provided between the upper electrode 30 and lower electrode 16.

The upper electrode 30 is supported on the top of the processing container 12 through an insulating shielding member 32. The upper electrode 30 may include an electrode plate 34 and an electrode support 36. The electrode plate 34 faces the processing space S, and provides a plurality of gas discharge holes 34a. The electrode plate 34 may be made of a low resistance conductor or a semiconductor generating less Joule heat.

The electrode support 36 is configured to detachably support the electrode plate 34, and may be made of a conductive material such as, for example, aluminum. The electrode support 36 may have a water-cooled structure. A gas diffusion chamber 36a is provided within the electrode support 36. A plurality of gas passage holes 36b extends downwardly from the gas diffusion chamber 36a to communicate with the gas discharge holes 34a. Further, a gas introducing port 36c is formed in the electrode support 36 to introduce a processing gas into the gas diffusion chamber 36a, and a gas supply pipe 38 is connected to the gas introducing port 36c.

Figure 7:
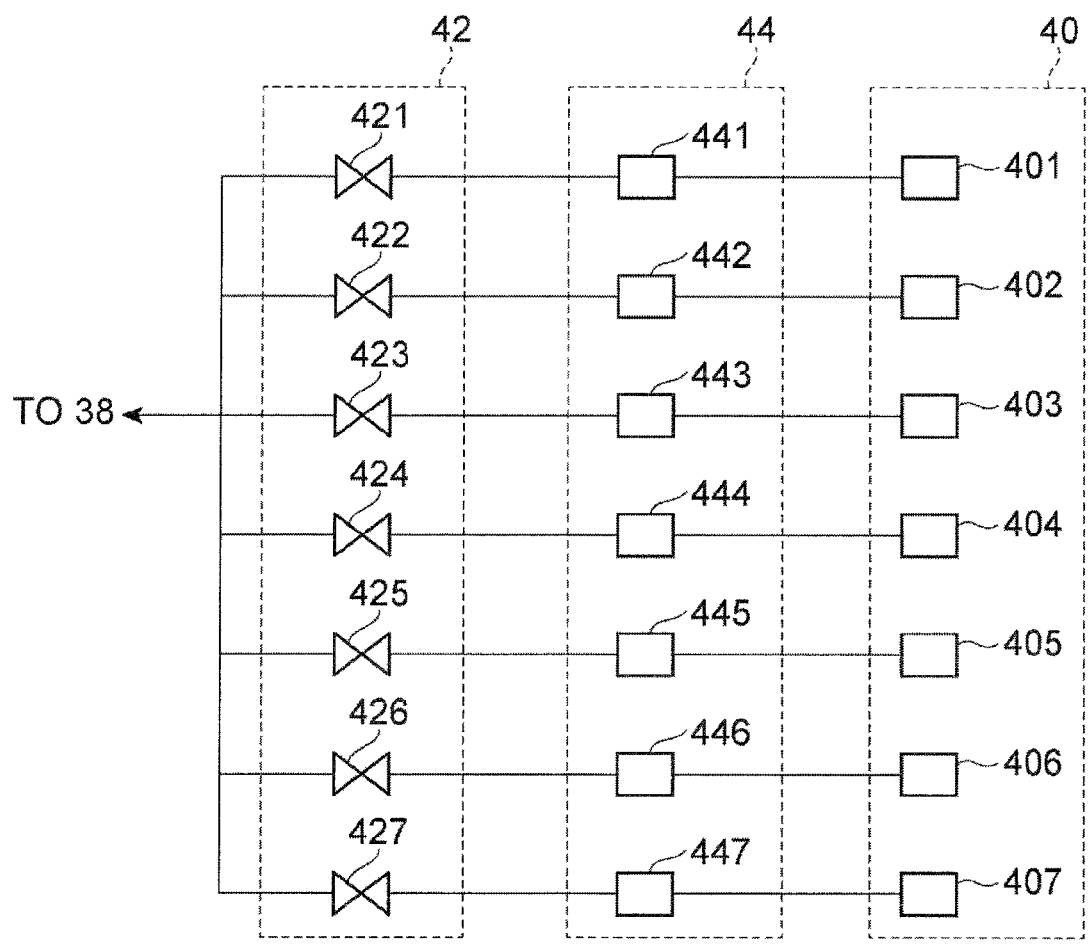
FIG. 7 is a view illustrating a valve group, a flow rate controller group, and a gas source group which are illustrated in FIG. 6, in detail.

A gas source group 40 is connected to the gas supply pipe 38 via a valve group 42 and a flow rate controller group 44. FIG. 7 is a view illustrating a valve group, a flow rate controller group, and a gas source group which are illustrated in FIG. 6, in detail. As illustrated in FIG. 7, the gas source group 40 includes a plurality of gas sources 401 to 407. The gas source 401 is a source of a silicon containing gas, and is a source of, for example, $SiCl_4$ gas and/or $SiF_4$ gas. The gas source 402 is a source of an oxygen containing gas and/or a hydrogen containing gas. As described above, the oxygen containing gas may be, for example, $O_2$. Further, the hydrogen containing gas may be hydrocarbon gas, for example, $CH_4$ gas. The gas source 403 is a source of $H_2$ gas. Further, the gas source 403 may be a source of arbitrary hydrogen gas. The gas source 404 is a gas source of HBr gas. The gas source 405 is a source of $NF_3$ gas. The gas source 406 is a source of $CH_2F_2$ gas. Further, the gas source 406 may be a gas source of arbitrary fluorocarbon-based gas. The fluorocarbon-based gas may be fluorocarbon gas or fluorohydrocarbon gas. As the fluorocarbon gas, $C_4F_6$ gas, $C_4F_8$ gas, and $CF_4$ gas are exemplified, and as the fluorohydrocarbon gas, $CH_3F$ gas, and $CHF_3$ are exemplified in addition to $CH_2F_2$ gas. Further, the gas source 407 is a source of $CH_4$ gas. Further, the gas source 407 may be a source of arbitrary hydrocarbon gas.

The flow rate controller group 44 includes a plurality of (N) flow rate controllers 441 to 447. Each of the flow rate controllers 441 to 447 controls a flow rate of a gas supplied from the corresponding gas source. Each of these flow rate controllers 441 to 447 may be a mass flow controller, or may be an FCS. The valve group 42 includes a plurality of (N) valves 421 to 427. The gas sources 401 to 407 are connected to the gas supply pipe 38 via the flow rate controllers 441 to 447 and the valves 421 to 427, respectively. The gases of the gas sources 401 to 407 reach the gas diffusion space 36a from the gas supply pipe 38, and are ejected into the process space S through the gas passage holes 36b and the gas diffusion container 36a.

Returning back to FIG. 6 again, the plasma processing apparatus 10 may further include a grounding conductor 12a. The grounding conductor 12a has a substantially cylindrical shape and is provided to extend to a higher side than the height position of the upper electrode 30 from the side wall of the processing container 12.

Further, in the plasma processing apparatus 10, a deposition shield 46 is detachably provided along the inner wall of the processing container 12. The deposition shield 46 is also provided on the outer periphery of the support 14. The deposition shield 46 is configured to prevent by-products of etching from being attached on the processing container 12, and may be formed by coating a ceramic such as, for example, $Y_2O_3$, on an aluminum material.

At the bottom side of the processing container 12, an exhaust plate 48 is provided between the support 14 and the inner wall of the processing container 12. The exhaust plate 48 may be formed by coating a ceramic such as, for example, $Y_2O_3$, on an aluminum material. An exhaust port 12e is formed below the exhaust plate 48 in the processing container 12. An exhaust device 50 is connected to the exhaust port 12e through an exhaust pipe 52. The exhaust device 50 includes a vacuum pump such as, for example, a turbo molecular pump, and may decompress the inside of the processing container 12 to a desired vacuum degree. A carry-in/out port 12g of the wafer W is formed on the side wall of the processing container 12. The carry-in/out port 12g is configured to be capable of being opened/closed by a gate valve 54.

On the inner wall surface of the processing container 12, a conductive member (GND block) 56 is provided. The conductive member 56 is attached on the inner wall surface of the processing container 12 so as to be positioned at the substantially same height as the wafer W in the vertical direction. The conductive member 56 is grounded in a DC manner, and exhibits an abnormal discharge prevention effect. The conductive member 56 may be provided in a plasma generation region, and the position where the conductive member 56 is not limited to the position illustrated in FIG. 6.

Further, the plasma processing apparatus 10 further includes a first high frequency power supply 62 and a second high frequency power supply 64. The first high frequency power supply 62 generates a first high frequency power for plasma generation, and generates a high frequency power having a frequency in a range of 27 MHz to 100 MHz, for example, 100 MHz. The first high frequency power supply 62 is connected to the lower electrode 16 via a matching unit 66. The matching unit 66 is a circuit that matches an output impedance of the first high frequency power supply 62 with an input impedance of a load side (a lower electrode 16 side). Further, the first high frequency power supply 62 may be connected to the upper electrode 30 via the matching unit 66.

The second high frequency power supply 64 generates a second high frequency power for drawing ions into the wafer W, i.e. a high frequency bias power, and generates a high frequency bias power having a frequency in a range of 400 kHz to 13.56 MHz, for example, a high frequency bias power of 400 MHz. The second high frequency power supply 64 is connected to the lower electrode 16 via a matching unit 68. The matching unit 68 is a circuit that matches an output impedance of the second high frequency power supply 64 with an input impedance of a load side (a lower electrode 16 side).

The plasma processing apparatus 10 further includes a DC power supply 70. The DC power supply 70 is connected to the upper electrode 30. The DC power supply 70 is capable of generating a negative DC voltage, and applying the DC voltage to the upper electrode 30.

In an exemplary embodiment, the plasma processing apparatus 10 may further include a control unit Cnt. The control unit Cnt is, for example, a computer provided with, for example, a processor, a storage unit, an input device, and a display device, and controls respective components of the plasma processing apparatus 10. With the control unit Cnt, an operator may perform, for example, an input operation of a command through the input device in order to manage the plasma processing apparatus 10, and the display device may visualize and display the operating situation of the plasma processing apparatus 10. The storage unit of the control unit Cnt is stored with a control program that allows the processor to control respective processings executed in the plasma processing apparatus 10, or a program that causes respective components of the plasma processing apparatus 10 to execute the processings according to processing conditions, that is, a processing recipe.

Specifically, the control unit Cnt transmits a control signal to the flow rate controllers 441 to 442, the valves 421 to 422, and the exhaust device 50 when first step ST1 is performed. Thus, a mixed gas is supplied into the processing container 12, and the pressure within the processing container 12 becomes a set pressure. Further, the control unit Cnt transmits the control signal to the first high frequency power supply 62, when first step ST1 is performed. Thus, the high frequency power from the first high frequency power supply 62 is supplied to the lower electrode 16. Further, in first step ST1, the high frequency bias power may not be supplied to the lower electrode 16, or may be supplied to the lower electrode 16.

In an example, various conditions in first step ST1 are set to be, for example, in the ranges represented below.

Flow rate of $SiCl_4$ gas: 5 sccm to 100 sccm
Flow rate of $O_2$ gas: 5 sccm to 100 sccm
Frequency of high frequency power of first high frequency power supply 62: 27 MHz to 100 MHz
High frequency power of first high frequency power supply 62: 200 W to 2000 W
Frequency of high frequency power of second high frequency power supply 64: 0.4 MHz to 13 MHz
High frequency power of second high frequency power supply 64: 0 W to 300 W
Pressure within processing container 12: 0.67 Pa to 6.7 Pa (5 mT to 50 mT)

Further, the control unit Cnt transmits a control signal to the flow rate controllers 443 to 447, the valves 423 to 427, and the exhaust device 50 when second step ST2 is performed. Thus, a processing gas is supplied into the processing container 12, and the pressure within the processing container 12 becomes a set pressure. Further, the control unit Cnt transmits the control signal to the first high frequency power supply 62 and the second high frequency power supply 64 when second step ST2 is performed. Thus, the high frequency power from the first high frequency power supply 62 and the high-frequency bias power from the second high frequency power supply 64 are supplied to the lower electrode 16.

In an example, various conditions in second step ST2 are set to be, for example, in the ranges represented below.

Flow rate of $H_2$ gas: 50 sccm to 300 sccm
Flow rate of HBr gas: 10 sccm to 100 sccm
Flow rate of $NF_3$ gas: 50 sccm to 100 sccm
Flow rate of $CH_4$ gas: 10 sccm to 100 sccm
Flow rate of $CH_2F_2$ gas: 40 sccm to 150 sccm
Frequency of high frequency power of first high frequency power supply 62: 27 MHz to 100 MHz
High frequency power of first high frequency power supply 62: 500 W to 2700 W
Frequency of high frequency power of second high frequency power supply 64: 0.4 MHz to 13 MHz
High frequency power of second high frequency power supply 64: 1000 W to 4000 W
Pressure within processing container 12: 1.33 Pa to 13.3 Pa (10 mT to 100 mT)

Further, when second step ST2 is performed, the control unit Cnt transmits a control signal to the first high frequency power supply 62 and the second high frequency power supply 64 such that the high frequency powers from the first high frequency power supply 62 and the second high frequency power supply 64 are supplied to the lower electrode 16 while ON and OFF of the high frequency powers are switched in a pulse form. In addition, the control unit Cnt may transmit the control signal to the DC power supply 70 such that a negative DC voltage having a larger absolute value than that in a period where the high frequency power is turned ON is applied to the upper electrode 30 in a period where the high frequency power is turned OFF. For example, the absolute value of the negative DC voltage in a period where the high frequency power is turned ON is in a range of 150 V to 500 V, and the absolute value of the negative DC voltage in a period where the high frequency power is OFF is in a range of 350 V to 1000 V. Further, the ON and OFF frequency of the high frequency power of each of the first high frequency power supply 62 and the second high frequency power supply 64 is, for example, 1 kHz to 40 kHz. Here, the ON and OFF frequency of the high frequency power of each of the first high frequency power supply 62 and the second high frequency power supply 64 refers to a frequency in which a period consisting of a period where the high frequency power is turned ON and a period where the high frequency power is turned OFF forms one cycle. In addition, a duty ratio occupied by a period in which the high frequency power is turned ON in one cycle, is, for example, 50% to 90%. Further, the switching of the DC voltage values of the DC power supply 70 may be synchronized to the switching between ON and OFF of the high frequency power of each of the first high frequency power supply 62 and the second high frequency power supply 64.

In an exemplary embodiment in which the negative DC voltage is used as described above, plasma is generated when the high frequency power is ON, and plasma existing immediately above the wafer W is lost when the high frequency power is OFF. Further, when the high frequency power is OFF, positive ions are drawn to and collide against the upper electrode 30 by the negative DC voltage applied to the upper electrode 30. Thus, secondary electrons are emitted from the upper electrode 30. The emitted secondary electrons modify the mask layer ML so that the etching resistance can be improved. Further, the secondary electrons neutralize the charged state of the wafer W, and as a result, the linearity of ions within the openings formed in the etching target layer EL increases.

Hereinafter, a test example performed to evaluate the method MT will be described. In this test example, a wafer which is the same as the wafer W illustrated in FIGS. 2 and 3A was provided. The mask layer ML of the provided wafer was made of an amorphous carbon film, a plurality of holes having a diameter of 100 nm was formed in four rows, a pitch between rows was 150 nm, and a pitch between holes in each row was 150 nm. The etching target layer included twenty four (24) pairs (48 layers) of laminated films, each pair including a first dielectric film made of silicon oxide and a second dielectric film made of silicon nitride, and the total thickness of the etching target layer EL was 3 μm. The laminated films may be at least 2 or more layers without being limited to 48 layers. First step ST1 and second step ST2 were performed on the wafer under the following conditions using the plasma processing apparatus 10.

<Condition of First Step ST1 in Test Example>
Mixed gas: $SiCl_4$ gas (25 sccm), $O_2$ gas (25 sccm), and He gas (200 sccm)
Pressure within processing container 12: 1.333 Pa (10 mTorr)
High frequency power of first high frequency power supply 62: 100 MHz, 500 W
High frequency power of second high frequency power supply 64: 400 kHz, 0 W
Processing time: 15 seconds
<Condition of Second Step ST2 in Test Example>
Processing gas: $H_2$ gas (170 sccm), HBr gas (80 sccm), $NF_3$ gas (140 sccm), $CH_2F_2$ gas (90 sccm), and $CH_4$ gas (70 sccm)
Pressure within the processing container 12: 4 Pa (30 mTorr)
High frequency power of first high frequency power supply 62: 100 MHz, 2000 W
High frequency power of second high frequency power supply 64: 400 kHz, 4000 W
Processing time: 350 seconds Further, in a comparative test example, second step ST2 was performed on the wafer which is the same as the test example without performing first step ST1.

Further, the widths (diameters) of the plurality of holes formed on the etched layer EL in a boundary portion with the base layer were measured. As a result, the maximum difference in widths between the both side rows of holes among the four rows of holes and the two central rows of holes was 6 nm in the comparative test example. Meanwhile, in the test example, the maximum difference in widths between the both side rows of holes among the four rows of holes and the two central rows of holes was 2 nm. In view of this, it has been confirmed that it is possible to reduce the difference in the widths among the plurality of openings formed in the etching target layer by the method MT.

Although some exemplary embodiments are described above, various modified exemplary embodiments may be implemented without being limited to the exemplary embodiments described above. For example, the plasma processing apparatus which may be used for performing the method MT is not limited to the capacitively coupled plasma processing apparatus. For example, various plasma processing apparatuses such as, for example, an inductively coupled plasma processing apparatus or a plasma processing apparatus in which plasma is generated by surface waves such as, for example, microwaves, may be used for performing the method MT.

Further, in the exemplary embodiment described above, the etching target layer EL may have more than twenty four pairs or less than twenty four pairs of laminated films. Further, the etching target layer EL may be a single layer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method for etching an etching target layer, the etching method comprising:
   depositing a plasma reaction product on a mask layer made of an organic film formed on the etching target layer; and
   etching the etching target layer after the depositing the plasma reaction product,
   wherein the mask layer includes a coarse region in which a plurality of openings are formed, and a dense region surrounding the coarse region, the mask layer existing more densely in the dense region than in the coarse region,
   the coarse region includes a first region and a second region positioned close to the dense region compared to the first region, and
   in the depositing the plasma reaction product, a width of the openings in the first region becomes narrower than a width of the openings in the second region.

2. The etching method of claim 1, wherein, in the depositing the plasma reaction product, plasma of a mixed gas including a silicon containing gas, an oxygen containing gas, and/or a hydrogen containing gas is generated.

3. The etching method of claim 2, wherein the silicon containing gas includes $SiCl_4$ or $SiF_4$.

4. The etching method of claim 2, wherein the oxygen containing gas is $O_2$ gas.

5. The etching method of claim 2, wherein the hydrogen containing gas is hydrocarbon gas.

6. The etching method of claim 5, wherein the hydrogen containing gas is $CH_4$.

7. The etching method of claim 1, wherein the etching target layer is a multilayer film formed by alternately laminating a first dielectric film made of silicon oxide and a second dielectric film made of silicon nitride.

8. The etching method of claim 7, wherein, in the etching the etching target layer, plasma of a processing gas including hydrogen gas, hydrogen bromide gas, and nitrogen trifluoride gas and further including at least one of hydrocarbon gas, fluorohydrocarbon gas, and fluorocarbon gas, is generated.

9. The etching method of claim 8, wherein the fluorohydrocarbon gas is $CH_2F_2$ gas, $CH_3F$ gas, or $CHF_3$ gas.

10. The etching method of claim 1, wherein the organic film is an amorphous carbon film.

\* \* \* \* \*